US010615038B2

(12) United States Patent
Liang et al.

(10) Patent No.: US 10,615,038 B2
(45) Date of Patent: Apr. 7, 2020

(54) METHOD OF MAKING N-TYPE DOPED GALLIUM OXIDE THROUGH THE DEPOSITION OF A TIN LAYER ON THE GALLIUM OXIDE

(71) Applicant: Dalian University of Technology, Dalian, Liaoning Province (CN)

(72) Inventors: Hongwei Liang, Dalian (CN); Xiaochuan Xia, Dalian (CN); Heqiu Zhang, Dalian (CN)

(73) Assignee: DALIAN UNIVERSITY OF TECHNOLOGY, Dalian, Liaoning Province (CN)

( * ) Notice: Subject to any disclaimer, the term of this patent is extended or adjusted under 35 U.S.C. 154(b) by 96 days.

(21) Appl. No.: 16/314,601

(22) PCT Filed: Mar. 26, 2017

(86) PCT No.: PCT/CN2017/078235
§ 371 (c)(1),
(2) Date: Dec. 31, 2018

(87) PCT Pub. No.: WO2018/149017
PCT Pub. Date: Aug. 23, 2018

(65) Prior Publication Data
US 2019/0252191 A1 Aug. 15, 2019

(30) Foreign Application Priority Data

Feb. 16, 2017 (CN) .......................... 2017 1 0079419

(51) Int. Cl.
*H01L 21/225* (2006.01)
(52) U.S. Cl.
CPC ........ *H01L 21/225* (2013.01); *H01L 21/2258* (2013.01)

(58) Field of Classification Search
CPC ........................... C30B 31/02; H01L 21/2258
See application file for complete search history.

(56) References Cited

U.S. PATENT DOCUMENTS

2016/0312380 A1* 10/2016 Sasaki .................. C30B 23/025

FOREIGN PATENT DOCUMENTS

| CN | 102320650 A | 1/2012 |
| CN | 103469299 A | 12/2013 |

* cited by examiner

*Primary Examiner* — Ermias T Woldegeorgis
(74) *Attorney, Agent, or Firm* — Muncy, Geissler, Olds & Lowe, P.C.

(57) ABSTRACT

The invention belongs to the technical field of semiconductor material preparation, and in particular provides a preparation method of tin doped n-type gallium oxide. To predeposit the appropriate tin doping source on gallium oxide materials in proper ways. The gallium oxide material is then placed in a high temperature tube in an appropriate manner. Then the tin atoms can be controlled to diffuse into the gallium oxide material by heat treatment at a certain temperature for a period of time. Then the tin atoms can be activated as an effective donor to realize the n-type doping of the gallium oxide material. In this invention, the doping can be realized after the preparation of the gallium oxide material is completed, and the necessary equipment and process are simple, and the doping controllability is high. The tin doping technique can not only fabricate the vertical structure device based on the n-type gallium oxide material, but also fabricate the transverse device structure and integrate various devices, so as to develop a new gallium oxide-based device which cannot be fabricated by the traditional doping technique.

5 Claims, 1 Drawing Sheet

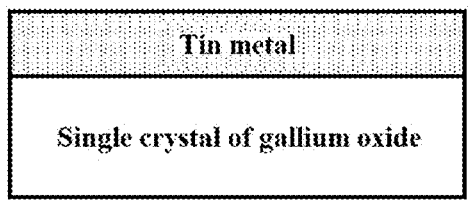
Fig. 1(Fig.1 as an illustration in Abstract)
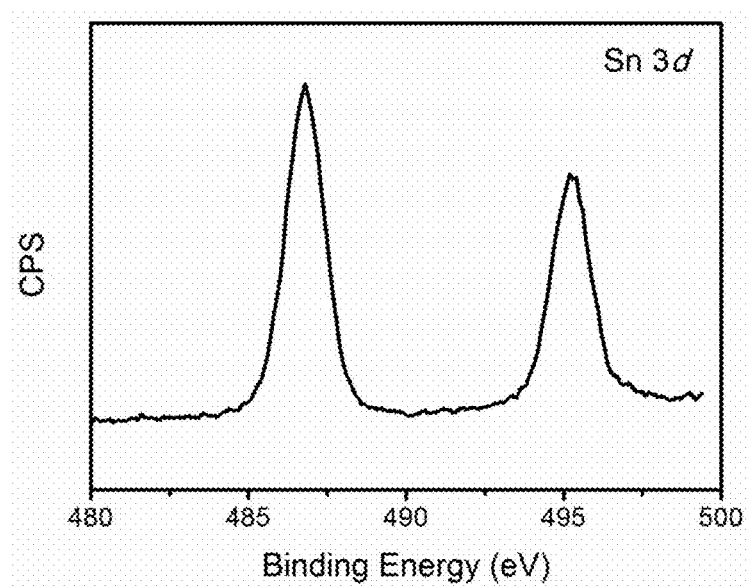
Fig. 2
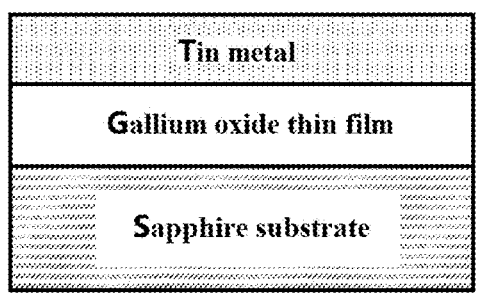
Fig. 3

METHOD OF MAKING N-TYPE DOPED GALLIUM OXIDE THROUGH THE DEPOSITION OF A TIN LAYER ON THE GALLIUM OXIDE

TECHNICAL FIELD

The invention belongs to the technical field of semiconductor material preparation, and in particular provides a preparation method of tin doped n-type gallium oxide.

BACKGROUND

The third-generation wide band gap semiconductor materials represented by gallium oxide have many outstanding advantages, such as wide band gap, high breakdown electric field, high electron saturation drift speed, corrosion resistance and irradiation resistance. It has important applications in the fabrication of high-efficiency ultraviolet detectors, gas sensors, friendly biosensors, and high-frequency, high-power, anti-radiation and other electronic devices. The materials of gallium oxide with electronic or hole conductivity are the basis for the preparation of the above-mentioned devices, and are also the research hotspot in the field of gallium oxide materials preparation. At present, most of the undoped gallium oxide materials show high resistivity, but it can show electronic or hole conductivity by doping appropriate amount of dopants, at the same time, its resistivity can be significantly reduced. At present, the control of the conductivity type of gallium oxide materials is achieved by doping in the growth process. Such as the doping of gallium oxide single crystal is to add appropriate tin or silicon elements into the precursor to obtain electronic conductivity. The doping of gallium oxide thin films is to increase tin or silicon elements in the reaction source to obtain electron conduction characteristics. The above methods can only be used to design the vertical devices, i.e. along the growth direction, but cannot be used to design the transverse structure of the devices. It seems powerless in the aspect of multi-type device integration. It is not conducive to the development and application of new devices.

Especially when the saturated vapor pressure of tin and silicon is a little low below 1000 degrees, it is difficult for tin and silicon to enter into gallium oxide by vapor diffusion to form n-type conductivity.

SUMMARY

The object of this invention is to propose a tin diffusion doping method to solve the problem of doping technology of gallium oxide materials. This method is to pre-deposit the appropriate tin doping source on gallium oxide materials in proper ways. The gallium oxide material is then placed in a high temperature tube in an appropriate manner. Then the tin atoms can be controlled to diffuse into the gallium oxide material by heat treatment at a certain temperature for a period of time. Then the tin atoms can be activated as an effective donor to realize the n-type doping of the gallium oxide material.

The Technical Proposal of the Invention

The preparation process of tin doped n-type gallium oxide is as follows:

The first step. The tin doped source is pre-deposited on gallium oxide material or the tin doped source is directly covered on the gallium oxide material. The thickness of tin doped source is 1 nm~1 mm.

The second step. One of the following methods is to place gallium oxide materials safely:

Methods 1. Under normal pressure, the gallium oxide material treated by step 1 was placed in a quartz boat or quartz tube.

Methods 2. Gallium oxide material treated by step 1 was sealed in quartz tube, and the vacuum degree in quartz tube was less than $1\times10^{-3}$ Pa.

Methods 3. GaO material and tin doping source were sealed together in the quartz tube after step 1 treatment. The vacuum degree in the quartz tube was less than $1\times10^{-3}$ Pa.

The third step. The gallium oxide material placed in step 2 is heat treated at 100~1500 degree for 1~24 hours.

When the gallium oxide material is placed by method 1, the heat treatment is carried out under the protection of high purity nitrogen or argon gas.

The forth step. After the temperature drops to room temperature, tin doped n-type gallium oxide is removed.

The fifth step. Follow-up treatment of tin-doped n-type gallium oxide: clean the residue on the surface of tin-doped n-type gallium oxide with a cleaning solution, then clean the residue with deionized water; blow-dry the gallium oxide material and keep it properly.

The gallium oxide material is a single crystal, a polycrystal and an epitaxial film prepared on a substrate; the tin doping source is a tin elementary material or an oxide of tin.

The optimum heat treatment temperature is 700° C.~1200° C., and the optimum heat treatment time is 2 h~12 h.

The optimum thickness of the tin doped source layer is 10 nm~10 μm.

The cleaning solution is one or more mixtures of hydrochloric acid, hydrofluoric acid, sulfuric acid, nitric acid, hydrogen peroxide, sodium hydroxide and potassium hydroxide.

The heater equipment used in the heat treatment process includes box furnace, tubular furnace and RTP rapid annealing furnace controlled by single or multiple temperature zones.

The deposition methods are sol-gel method, thermal evaporation method, electron beam evaporation method, magnetron sputtering method, laser pulse deposition, atomic layer epitaxy or molecular beam epitaxy.

The beneficial effect of the invention is: The prominent advantage of the invention is that the doping can be realized after the preparation of the gallium oxide material is completed, and the necessary equipment and process are simple, and the doping controllability is high. The tin doping technique can not only fabricate the vertical structure device based on the n-type gallium oxide material, but also fabricate the transverse device structure and integrate various devices, so as to develop a new gallium oxide-based device which cannot be fabricated by the traditional doping technique.

DESCRIPTION OF DRAWINGS

FIG. 1 is a schematic diagram of the gallium oxide single crystal with a tin predeposited layer.

FIG. 2 is an X-ray photoemission spectrograph of tin doped gallium oxide single crystals.

FIG. 3 is a schematic diagram of gallium oxide thin films with tin predeposited layer.

DETAILED DESCRIPTION

A detailed operation method of the invention is further illustrated with the following figures and technical plans.

Example 1

This example provides a method for tin doping of gallium oxide single crystals, including the following process steps:

Step 1: The selected gallium oxide material has a semi-insulating property with a thickness of 600 μm and a surface of 5 mm square. The selected doping source is high purity tin metal.

Step 2: A 100 nm thick tin layer was deposited on the gallium oxide single crystal by thermal evaporation, as shown in FIG. 1.

Step 3: Gallium oxide single crystal and 5 g tin were sealed together in quartz tube after step 2 treatment. The quartz tube was high vacuum and the vacuum degree is $3\times10^{-4}$ Pa.

Step 4: Place the sealed quartz tube in step 3 in a tubular furnace with a single temperature zone for heat treatment, and the treatment temperature is 1000° C. and the treatment time is 6 h.

Step 5: Remove the gallium oxide material after the temperature drops to room temperature.

Step 6: Clean the residues on the surface of gallium oxide by dilute hydrochloric acid.

Step 7: Use deionized water to clean the residues produced in step 6.

Step 8: Dry the gallium oxide material and preserve it properly.

The surface conductivity of tin doped gallium oxide in this example has been tested. The surface resistivity is 3400 Ω/sq and the surface electron concentration is $3.5\times10^{15}/cm^2$. FIG. 2 shows an X-ray photoelectric spectrogram on the surface of a single crystal of gallium oxide. The results show that tin-doped n-type gallium oxide has been successfully prepared by the technique described in the present invention.

Example 2

This example provides a tin doping method for gallium oxide thin film, including the following process steps:

Step 1: Gallium oxide thin film with a thickness of 2 μm and a surface of 10 mm square were prepared on sapphire substrate by MOCVD, and the doping source was high purity tin.

Step 2: A 10 nm thick tin layer was deposited on the gallium oxide single crystal by thermal evaporation, as shown in FIG. 3.

Step 3: Gallium oxide single crystal and 5 g tin were sealed together in quartz tube after step 2 treatment. The quartz tube was high vacuum and the vacuum degree is $3\times10^{-4}$ Pa.

Step 4: Place the sealed quartz tube in step 3 in a tubular furnace with a single temperature zone for heat treatment, and the treatment temperature is 1000° C. and the treatment time is 6 h.

Step 5: Remove the gallium oxide material after the temperature drops to room temperature.

Step 6: Clean the residues on the surface of gallium oxide by dilute hydrochloric acid.

Step 7: Use deionized water to clean the residues produced in step 6.

Step 8: Dry the gallium oxide material and preserve it properly.

The surface conductivity of tin doped gallium oxide in this example has been tested. The surface resistivity is 4500 Ω/sq and the surface electron concentration is $2.5\times10^{15}/cm^2$.

What should be explained in the end is: The above examples only serve to illustrate the technical proposal of the invention, rather than restrict it.

Although the invention is explained in detail by previous examples, general technical personnel in this field should understand: It can still modify the technical scheme recorded in the previous examples or replace some or all of the technical features equally. These modifications or substitutions do not detach the nature of the corresponding technical schemes from the scope of the technical schemes of the previous invention.

We claim:

1. A preparation method of tin doped n-type gallium oxide, comprising:

the first step, the tin doped source is pre-deposited on gallium oxide material or the tin doped source is directly covered on the gallium oxide material; the thickness of tin doped source is 1 nm~1 mm;

the second step, one of the following methods is to place gallium oxide materials safely:

methods 1, under normal pressure, the gallium oxide material treated by step 1 was placed in a quartz boat or quartz tube;

methods 2, gallium oxide material treated by step 1 was sealed in quartz tube, and the vacuum degree in quartz tube was less than $1\times10^{-3}$ Pa;

methods 3, GaO material and tin doping source were sealed together in the quartz tube after step 1 treatment; the vacuum degree in the quartz tube was less than $1\times10^{-3}$ Pa;

the third step, the gallium oxide material placed in step 2 is heat treated at 100~1500 degree for 1~24 hours;

when the gallium oxide material is placed by method 1, the heat treatment is carried out under the protection of high purity nitrogen or argon gas;

the forth step, after the temperature drops to room temperature, tin doped n-type gallium oxide is removed;

the fifth step, follow-up treatment of tin-doped n-type gallium oxide: clean the residue on the surface of tin-doped n-type gallium oxide with a cleaning solution, then clean the residue with deionized water; blow-dry the gallium oxide material and keep it properly.

2. The preparation of tin doped n-type gallium oxide according to claim 1, wherein the gallium oxide material is a single crystal, a polycrystal and an epitaxial film prepared on a substrate; the tin doping source is a tin elementary material or an oxide of tin.

3. The preparation of tin doped n-type gallium oxide according to claim 1, wherein the optimum heat treatment temperature is 700° C.~1200° C., and the optimum heat treatment time is 2 h~12 h.

4. The preparation of tin doped n-type gallium oxide according to claim 1, wherein the optimum thickness of the tin doped source layer is 10 nm~10 μm.

5. The preparation of tin doped n-type gallium oxide according to claim 1, wherein the cleaning solution is one or more mixtures of hydrochloric acid, hydrofluoric acid, sulfuric acid, nitric acid, hydrogen peroxide, sodium hydroxide and potassium hydroxide.

\* \* \* \* \*